US006762661B1

(12) United States Patent
Higgins

(10) Patent No.: US 6,762,661 B1

(45) Date of Patent: Jul. 13, 2004

(54) SHUTTER SWITCH FOR MILLIMETER WAVE BEAMS AND METHOD FOR SWITCHING

(75) Inventor: John A. Higgins, Westlake Village, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 344 days.

(21) Appl. No.: 09/675,696

(22) Filed: Sep. 29, 2000

(51) Int. Cl.[7] .............................. H01P 1/10; B81B 7/04

(52) U.S. Cl. ........................................ 333/258; 333/108

(58) Field of Search ................................ 333/101, 105, 333/108, 258, 262; 385/16, 17, 18

(56) References Cited

U.S. PATENT DOCUMENTS

| | | | | |
|---|---|---|---|---|
| 5,504,575 A | * | 4/1996 | Stafford | 356/330 |
| 5,526,172 A | * | 6/1996 | Kanack | 359/291 |
| 5,661,577 A | * | 8/1997 | Jenkins et al. | 359/11 |
| 5,793,906 A | * | 8/1998 | Huang | 385/17 |
| 6,501,869 B1 | * | 12/2002 | Athale | 385/18 |

OTHER PUBLICATIONS

Dorf, *The Electrical Engineering Handbook,* Second Edition, Section 37.2, p. 946 (1997).

IEEE Press, Paul F. Goldsmith, *Quasioptical Systems,* Chapter 1, and Chapter 2 (1999).

M. Kim et al., *A Rectangular TEM Waveguide with Photonic Crystal Walls for Excitation of Quasi–Optical Amplifiers,* (1999) MTI–S Archived on CD–ROM.

* cited by examiner

*Primary Examiner*—Robert Pascai

*Assistant Examiner*—Dean Takaoka

(74) *Attorney, Agent, or Firm*—Koppel, Jacobs, Patrick & Heybl

(57) ABSTRACT

A shutter switch is disclosed the is placed in the path of a millimeter beam and is either opaque or transparent to the beam. The shutter switch comprises a number of waveguides placed adjacent to one another to intercept the beam, a portion of the beam passing through each waveguide. The dimensions of each waveguide are such that transmission of the respective portion of the beam would be cut-off if the all of the waveguide walls were conductive. However, the waveguides have high impedance structures on at least two of their opposing interior walls that allow the beam at the design frequency to be transmitted through the waveguide with uniform density and minimal attenuation. At this design frequency the shutter switch to be essentially transparent to the beam. The high impedance structures can also be changed to a conductive surfaces such that all of the waveguides walls appear conductive and the waveguide takes on the characteristics of a metal rectangular waveguide. In this state transmission through each waveguide is cut-off and the shutter switch blocks transmission of the beam. The shutter switch can change states from blocking to transparent in microseconds or less while consuming very little power.

44 Claims, 9 Drawing Sheets

FIG.5
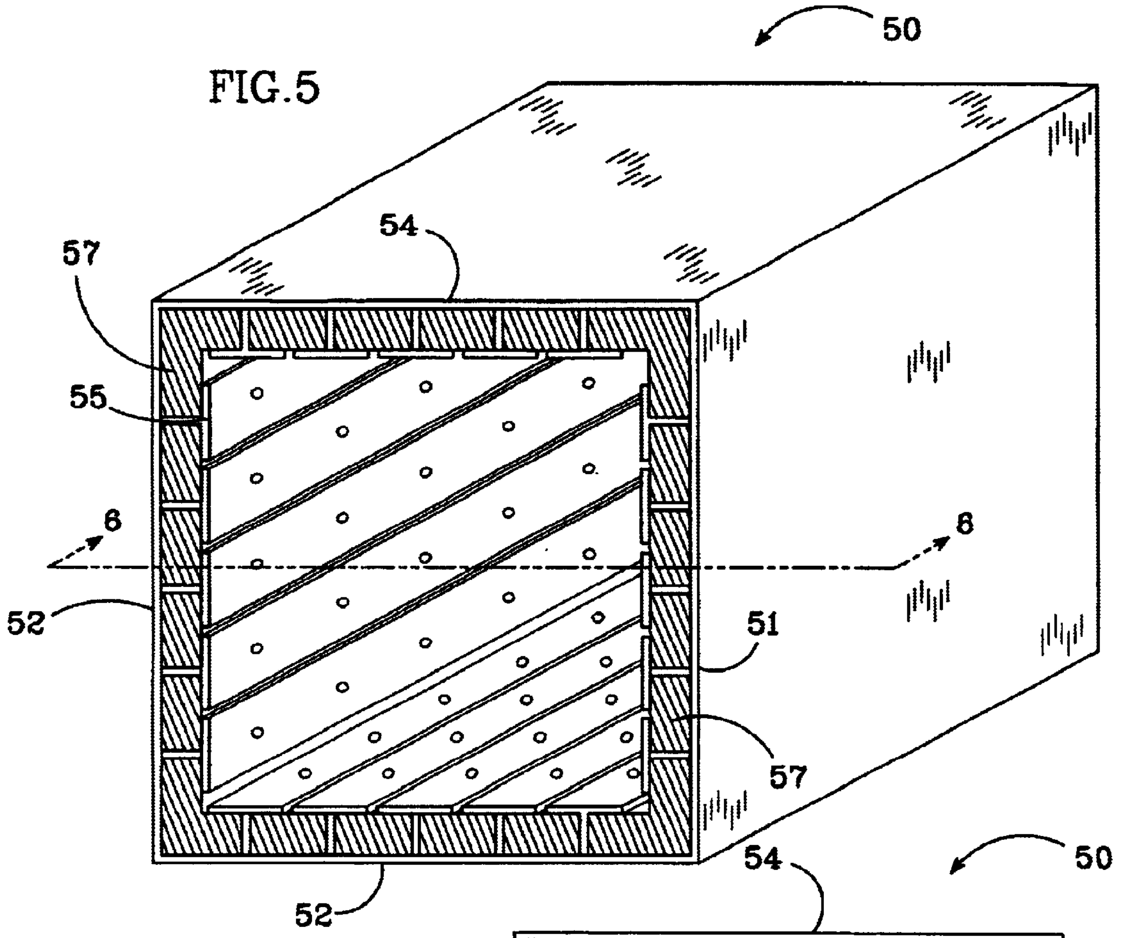
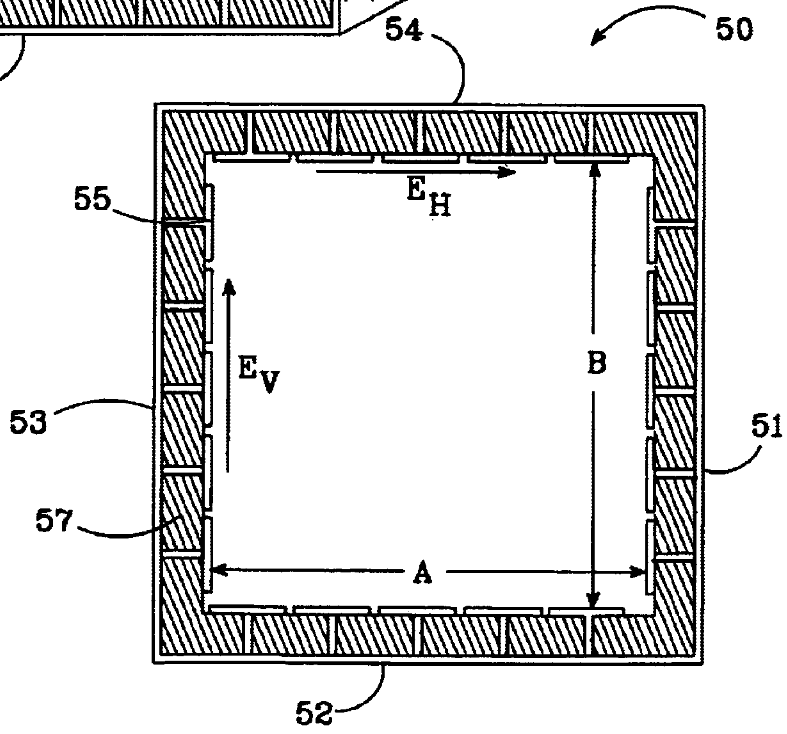
FIG.6

10
12
110
112
114
116
118
120
122
124

SHUTTER SWITCH FOR MILLIMETER WAVE BEAMS AND METHOD FOR SWITCHING

BACKGROUND OF THE INVENTION

1. Field of the Invention

The invention relates to millimeter wave beams and more particularly to a switch that either reflects or is transparent to a millimeter beam.

2. Description of the Related Art

Electromagnetic signals are commonly guided from a radiating element to a destination via a coaxial cable or metal waveguide. As the frequency of the signal increases, the coaxial cable or metal waveguide used to guide the signals have smaller cross-sections. For example, a metal waveguide that is 58.420 cm wide and 29.210 high at its inside dimensions, transmits signals in the range of 0.32 to 0.49 GHz. A metal waveguide that is 0.711 cm wide and 0.356 cm high at its inside dimensions, transmits signals in the range of 26.40 to 40.00 GHz. [Dorf, *The Electrical Engineering Handbook, Second Edition*, Section 37.2, Page 946 (1997)]. As the signal frequencies continue to increase a point is reached where the coaxial cables and waveguides become impractical. They become too small and expensive and require precision machining to produce. In addition, their insertion can become too great.

High frequency signals in the range of approximately 1 to 50 GHz, can be guided through a microstrip transmission line. However, at frequencies above this range, the microstrip suffers from the same problems; the transmission line becomes too small and the insertion loss from transmission through the line becomes too great.

Frequencies exceeding approximately 100 GHz (referred to as millimeter waves) should not be transmitted over a distance by a microstrip transmission line because of the insertion loss. Instead, the signal can be transmitted as a free-space beam. The signal from a radiating element is directed to a lens that focuses the signal into a millimeter wave beam having a diameter up to several centimeters. The beam is transmitted to a receiving lens that focuses the signal to a receiving element which often includes an amplifier. This form of transmission is referred to as "quasi-optic" when the lens diameter divided by the signal wavelength is in the range of approximately 1–10. In the optic regime, the lens diameter divided by the frequency wavelength is normally much greater than 10. [IEEE Press, Paul f. Goldsmith, *Quasi-optic Systems*, Chapter 1, Gaussian Beam Propagation and Applications (1999)]

For quasi-optic or optic transmission in military or commercial applications, a safety mechanism is normally needed in the beams path in the form of a shutter that either blocks the beam from reaching the component that needs protection, or allows the beam to reach the component. The mechanism is primarily used to protect delicate amplifiers at the receiving end of the transmission line from power surges at the radiating element. Mechanical shutters have been used for this purpose, but they are generally too slow at blocking the beam and are too unreliable because of complex mechanical components.

Another important characteristic of transmission in metal waveguides is the transmission cut-off frequency. If the frequency of the transmitted signal is above the cut-off frequency, the electromagnetic energy can be transmitted through the guide with minimal attenuation. Electromagnetic energy with a frequency below the cut-off will be totally reflected at entry to the guide and will be attenuated to a negligible value in a relatively short distance through the waveguide. The physical dimensions of a metal waveguide not only determines the range of frequencies that it transmits, but also the cut-off frequency for the fundamental (first) mode. The two waveguides described above have cut-off frequencies of 0.257 GHz and 21.097 GHz, respectively.

A structure has been developed that presents as a high impedance to transverse E fields of electromagnetic signals. [M. Kim et al., *A Rectangular TEM Waveguide with Photonic Crystal Walls for Excitation of Quasi-Optic Amplifiers*, (1999) IEEE MTT-S, Archived on CDROM]. The structure is particularly applicable to the sidewalls and/or top and bottom walls of metal rectangular waveguides. Either two or four of the waveguide's walls can have this structure, depending upon the polarizations of the signal being transmitted. The structure comprises a substrate of dielectric material with parallel strips of conductive material that are separated by small (capacitive) gaps. It also includes inductive metal vias through the sheet to a conductive sheet on the substrate's surface opposite the strips. At a certain frequency the inductance of the vias and the capacitance of the gaps resonate. At this "resonant" frequency, the surface impedance of becomes very high.

When used on a rectangular waveguide's sidewalls, the structure provides a high impedance boundary condition for the E field component of a fundamental mode vertically polarized signal, the E field being transverse to the conductive strips. The high impedance prevents the E field from dropping off near the waveguide's sidewalls, maintaining an E field of uniform density across the waveguide's cross-section. Current can flow down the waveguide's conductive top and bottom walls to support the signal's H field with uniform density. Accordingly, the signal maintains near uniform power density across the waveguide aperture.

When the high impedance structure is used on all four of the waveguide's walls, the waveguide can transmit independent cross-polarized signals each one being similar to a free-space wave having a near-uniform power density. The structure on the waveguide's sidewalls presents a high impedance to the E field of the vertically polarized signal, while the structure on the waveguide's top and bottom walls presents a high impedance to the horizontally polarized signal. The structure also allows conduction through the strips to support the signal's H field component of both polarizations. Thus, a cross-polarized signal of uniform density can be transmitted.

Waveguides employing these high impedance structures are also able to transmit signals close to the resonant frequency that would otherwise be cut-off because of the waveguide's dimensions if all of the waveguide's walls were conductive. At resonant frequency, the waveguide essentially has no cut-off frequency and can support uniform density signals when its width is reduced well below the width for which the frequency being transmitted would be cut-off in a metal waveguide.

SUMMARY OF THE INVENTION

The present invention provides a new millimeter beam shutter switch that is placed in a millimeter beams path and is either opaque and blocks the beam, or is transparent and allows the beam to pass with minimal attenuation. The new switch can change states between opaque and transparent in microseconds or less without employing complicated or unreliable mechanical components.

The new shutter switch includes a plurality of waveguides adapted to receive at least part of the electromagnetic beam. The waveguides are adjacent to one another with their longitudinal axes aligned with the propagation of the beam. The waveguides switchable to either transmit or block the transmission of their respective portions of the beam.

The new shutter switch uses rectangular waveguides with high impedance structures on at least two opposing interior walls. The high impedance structures allow smaller waveguides to transmit signals that would otherwise be cutoff if all of the waveguide's walls were conductive. The cross-section of each individual waveguide can be smaller than the beam's cross-section, and the shutter switch includes a sufficient number of waveguides to intercept the entire beam. The waveguides are mounted adjacent to one another to form a wall, with each of the waveguide's longitudinal axes aligned with the millimeter beam's propagation axis. Each of the high impedance structures has shorting switches that, when closed, cause the structure to change from a high impedance surface to a conductive surface.

One embodiment of the shutter switch uses waveguides that have high impedance structures on their sidewalls, which allows each of the waveguides to transmit uniform density, vertically polarized signals at a particular design frequency. The preferred high impedance sidewalls comprise a sheet of dielectric material with a conductive layer on one side. The opposite side of the dielectric material has a series of parallel conductive strips that are oriented down the waveguide's longitudinal axis. Each of the strips has a uniform width, with uniform gaps between adjacent strips. Vias of conductive material are provided through the dielectric material between the conductive layer and the conductive strips. The actual dimensions of the surface structure depend on the materials used and the signal frequency.

During transmission of a vertically polarized signal, the waveguide carries an E field component transverse to the surface structure's conductive strips. At a design frequency, the vias which extend through the substrate present an inductive reactance ($2\pi fL$), while the gaps between the strips present an approximately equal capacitive reactance ($1/(2\pi fC)$). The surface presents parallel resonant L-C circuits to the transverse E field component; i.e. a high impedance. The L-C circuits present an open-circuit to the transverse E-field, allowing it to remain uniform across the waveguide. The low impedance on the top and bottom waveguide walls allows current to flow and maintains a uniform H field. Each of the waveguides transmits the signal with uniform density, and the shutter switch appears transparent to the vertically polarized beams at the design frequency.

When the shorting switches on the high impedance structure are closed, the high impedance sidewalls are switched to a conductive surface. All of the waveguide's walls become conductive and, because of the waveguide's dimensions, signal transmission is cut-off. If the shorting switches are closed in all of the shutter switch's waveguides, transmission is blocked in all the waveguides and the shutter switch becomes opaque to the beam. Similarly, if the shutter switch has waveguides with the high impedance structure on the top and bottom walls, the shutter switch could be used to block or transmit horizontally polarized signals.

In another embodiment of the waveguide used to form a shutter switch, the high impedance structure is placed on all four of the waveguides walls. This allows the waveguide to transmit a cross-polarized signal (vertical and horizontal) at a particular resonant frequency. When the shorting switches are closed on the high impedance structure in all the waveguides, the shutter switch blocks transmission of the cross-polarized signal. The shorting switches can also be selectively closed to block transmission of only one polarization of the cross polarized signal. Closing the shorting switches on the waveguide's sidewalls blocks the vertically polarized signal, while closing the shorting switches on the top and bottom walls blocks the horizontally signal.

In still another embodiment, either two or all four of the waveguides sidewalls have a multi-layered high impedance structure which causes each of the layers to present a high impedance to a transverse E field at widely separated resonant frequencies. The number of frequencies that the waveguide can transmit with uniform density depends on the number of layers in the structure. When the multi-layered structure is on the sidewalls only, the waveguide transmits vertically polarized signals; when the multi-layered structure on the top and bottom walls, the waveguide transmits horizontally polarized signals. When the multi-layered structure is on all four of the waveguide's wall, the waveguide can transmit either a single polarized signal or both cross-polarized signals. Shorting switches on the multi-layered structures can be selectively closed to block transmission of one or both of the polarizations, at one of the different transmission frequencies.

Different shorting switches can be used to switch the high impedance surface structures to a conductive surface. The preferred switches consume a relatively small amount of power and employ varactor layer diode technology or micro electromechanical system (MEMS) technology.

These and other further features and advantages of the invention will be apparent to those skilled in the art from the following detailed description, taken together with the accompanying drawings, in which:

BRIEF DESCRIPTION OF THE DRAWINGS

FIG. 5 is a perspective view of a second embodiment of the waveguide with a high impedance structure on all its walls;

FIG. 6 is a sectional view of the waveguide in FIG. 5 taken along section lines 6—6;

DETAILED DESCRIPTION OF THE INVENTION

Figure 1:
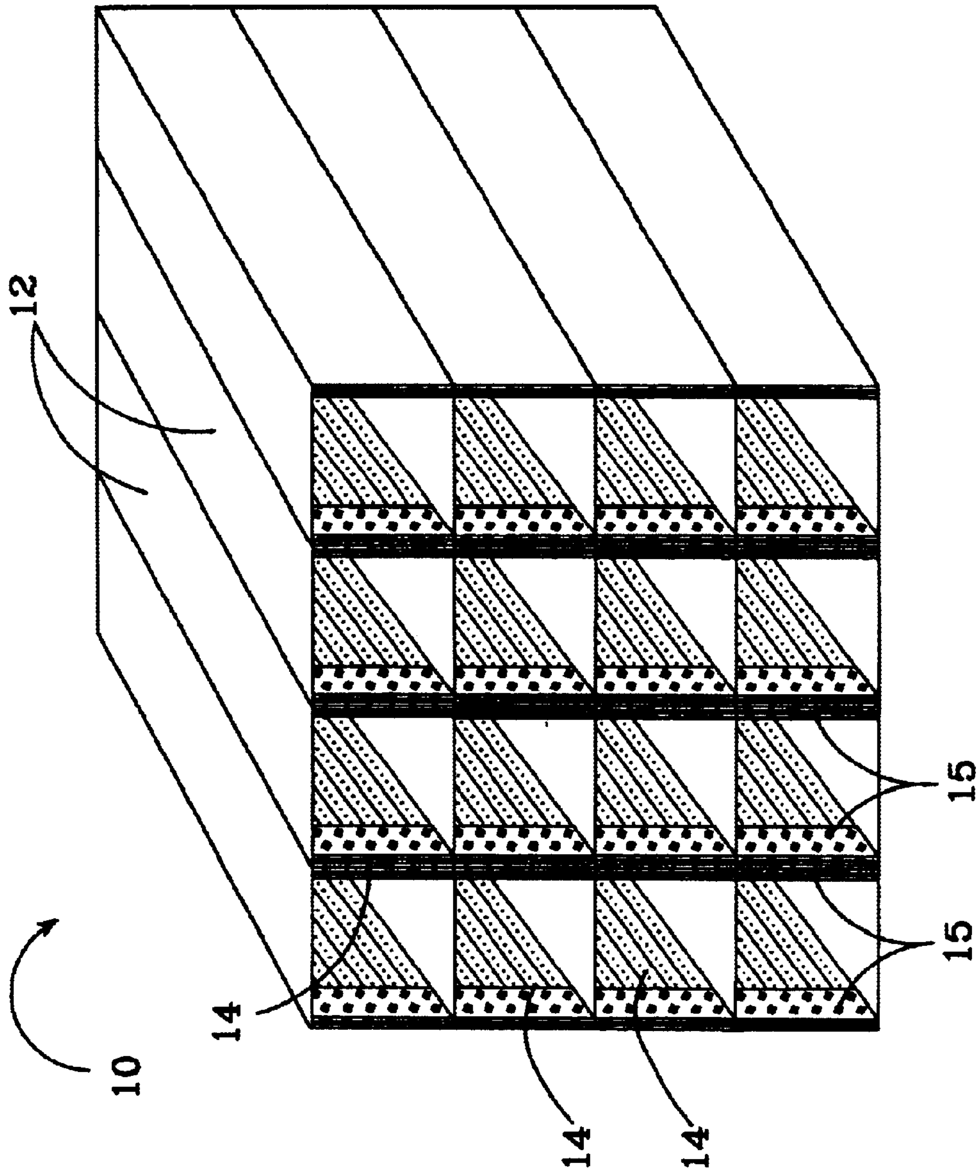
FIG. 1 is a perspective view of one embodiment of the new waveguide wall shutter switch.

FIG. 1 shows a new waveguide wall shutter switch 10 constructed in accordance with the present invention. It has individual waveguides 12 that are mounted adjacent to one another to form a rectangular wall resembling a. honeycomb. The shutter switch 10 is placed in the path of a millimeter beam of a particular resonant frequency and depending on whether the shutter switch is "on" or "off" it either blocks the beam or to allow to pass through. The shutter switch can have different cross-sections depending on the beam's cross-section and whether the entire beam is to be intercepted. For instance, additional waveguides can be included on the top, bottom and sides, to give the shutter switch 10 more of a circular cross-section.

The cross-section of each waveguide 12 is small enough that if all the waveguide's walls were conductive, transmission of the beam at a design frequency would be cut-off. To allow transmission, the waveguides 12 have structures 14 on two of their interior sidewalls that present are aligned with the signal's E field and present as a high impedance to the E field. The high impedance structure also has shorting switches that change the structure's 14 characteristics such that it appears as a conductive surface. When the switches are closed in all the waveguides in the shutter switch 10, the walls in each waveguide become conductive and because of the dimensions of each waveguide transmission of the signal is cut-off. The shutter switch 10 becomes opaque, blocking transmission of the beam.

A portion of the incoming beam can reflect off the front edges of the waveguides 12, degrading the signal. To reduce this reflection, each waveguide 12 can include a launching region 15 on each waveguide wall that has the high impedance structure. The launching region begins at the entrance of each waveguide 12 and continues for a short distance down the waveguide. It is similar to the thumbtack high impedance structure described above, and comprises "patches" of conductive material mounted in a substrate of dielectric material. "Vias" of conducting material running from each patch to a continuous conductive sheet on the opposite side of the dielectric substrate.

The launching region resonates at the frequency of the beam entering the waveguides in the module. The vias which extend through the substrate present an inductive reactance (L), while the gaps between the patches present an approximately equal capacitive reactance (C). The surface presents parallel resonant high impedance L-C circuits to the beams E field component The L-C circuits present an open-circuit to the E-field, allowing it to remain uniform across the waveguide. The low impedance on the top and bottom waveguide walls allows current to flow and maintains a uniform H field.

The gaps between the patches block surface current flow in all directions, preventing surface waves in the high impedance structures. This blocks TM and TE modes from entering the waveguide 12, only allowing TEM modes to enter. Blocking the TM and TE modes reduces the front edge reflection and the front edge of the waveguide appears nearly transparent to the beam at the resonant frequency.

In describing the various embodiments of the individual waveguides below, the launching region is not discussed or shown. However, to reduce reflection in any module comprised of the waveguides below, each waveguide should include a launching region.

Single Polarization Beams

Figure 2:
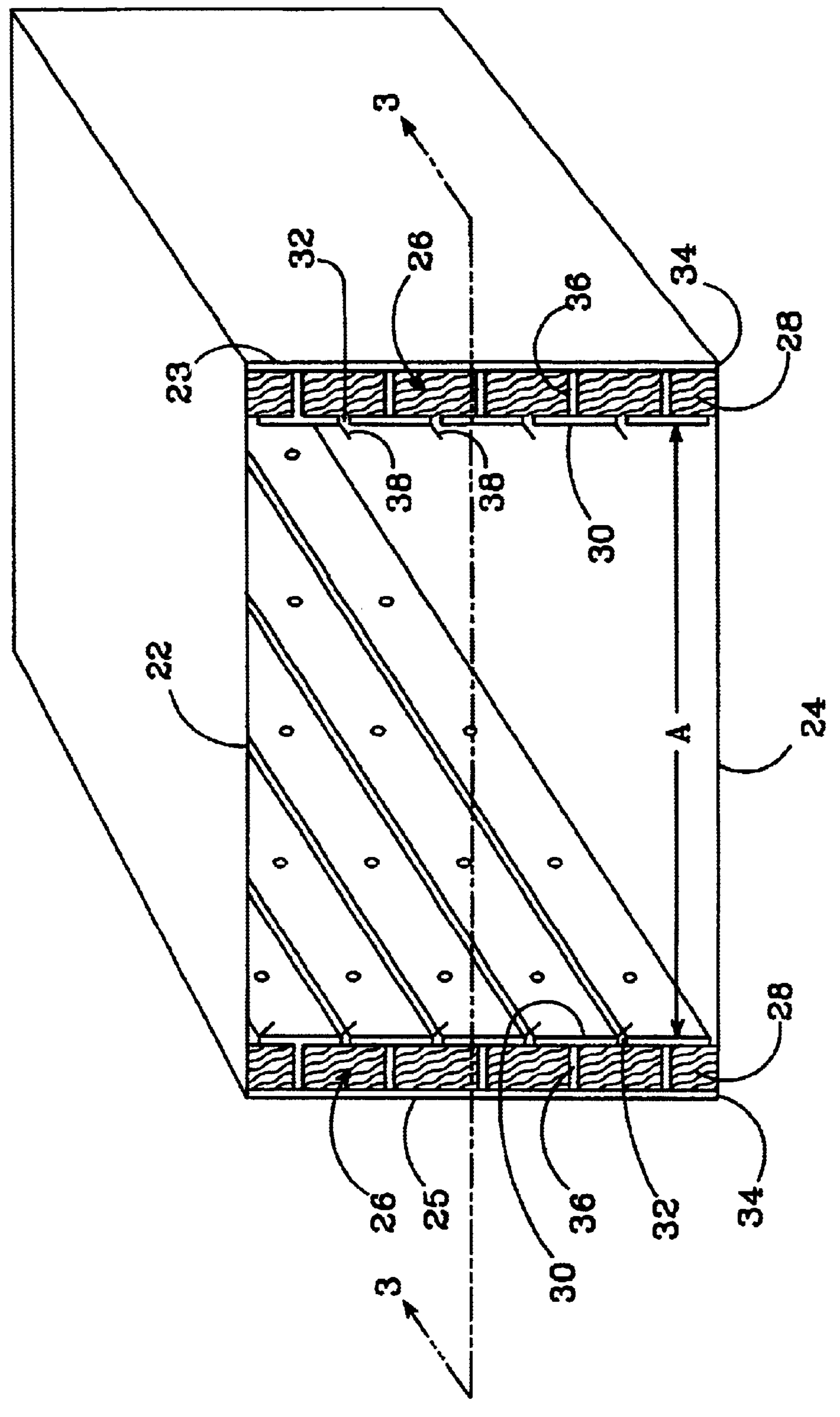
FIG. 2 is a perspective view of one of the waveguides in the shutter switch of FIG. 1, the waveguide having a high impedance structure on its sidewalls.
Figure 3:
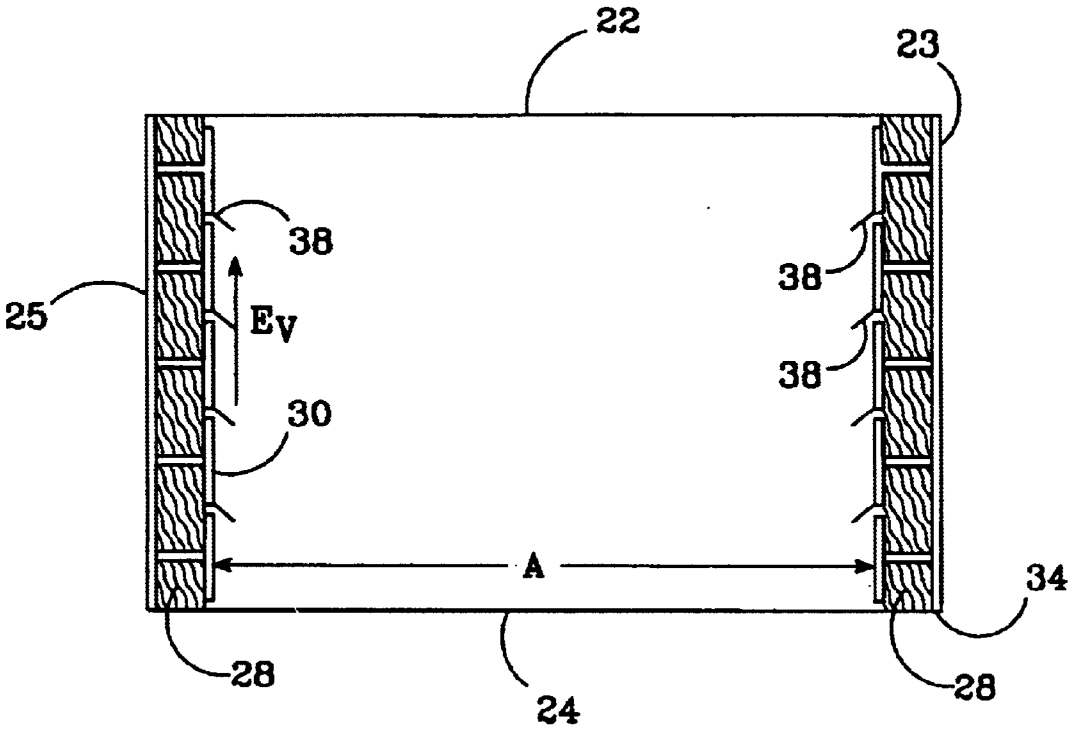
FIG. 3 is a sectional view of the waveguide in FIG. 2, taken along section lines 2—2.

FIGS. 2 and 3 show one embodiment of the waveguide 12 used to construct the shutter switch 10. Its top and bottom walls 22 and 24 are conductive, and the inside of its sidewalls 23, 25 have high impedance structure 26. The structure 26 includes a sheet of dielectric material 28 with conductive strips 30 of uniform width on one side, the conductive strips 30 having a uniform gap 32 between included on the side of the dielectric material 28 opposite the conductive strips 30. Vias 36 of conductive material are provided between the conductive strips 30 and the conductive layer 34, through the dielectric material 28. The conductive strips 32 are oriented longitudinally down the waveguide 12.

The wall structure 26 is manufactured using known methods and known materials. Numerous materials can be used as the dielectric material 28 including but not limited to plastics, poly-vinyl carbonate (PVC), ceramics, or high resistance semiconductor material such as Gallium Arsenide (GaAs), all of which are commercially available. Highly conductive material must be used for the conductive strips 30, conductive layer 34, and vias 36, and in the preferred embodiment all are gold.

The wall structure 26 is manufactured by first vaporizing a layer of conductive material on one side of the dielectric material 28 using any one of various known methods such as vaporization plating. Parallel lines of the newly deposited conductive material are etched away using any number of etching processes, such as acid etching or ion mill etching. The etched lines (gaps) are of the same width and equidistant apart, resulting in parallel conductive strips 30 on the dielectric material 28, the strips 30 having uniform width and a uniform gap 32 between adjacent strips.

Holes are created through the dielectric material 28 at uniform intervals, the holes continuing through the dielectric material 28 to the conductive strips 30 on the other side. The holes can be created by various methods, such as conventional wet or dry etching. They are then filled or covered with the conductive material and the uncovered side of the dielectric material is covered with a conductive material, both accomplished using sputtered vaporization plating. The holes do not need to be completely filled but the walls of the holes must be covered with the conductive material. The covered or filled holes provide conductive vias 36 between the conductive layer 34 and the conductive strips 30. The dimensions of the dielectric material 28, the conductive strips 34 and the vias 39 depend on the particular design frequency for the waveguide 12.

Figure 4:
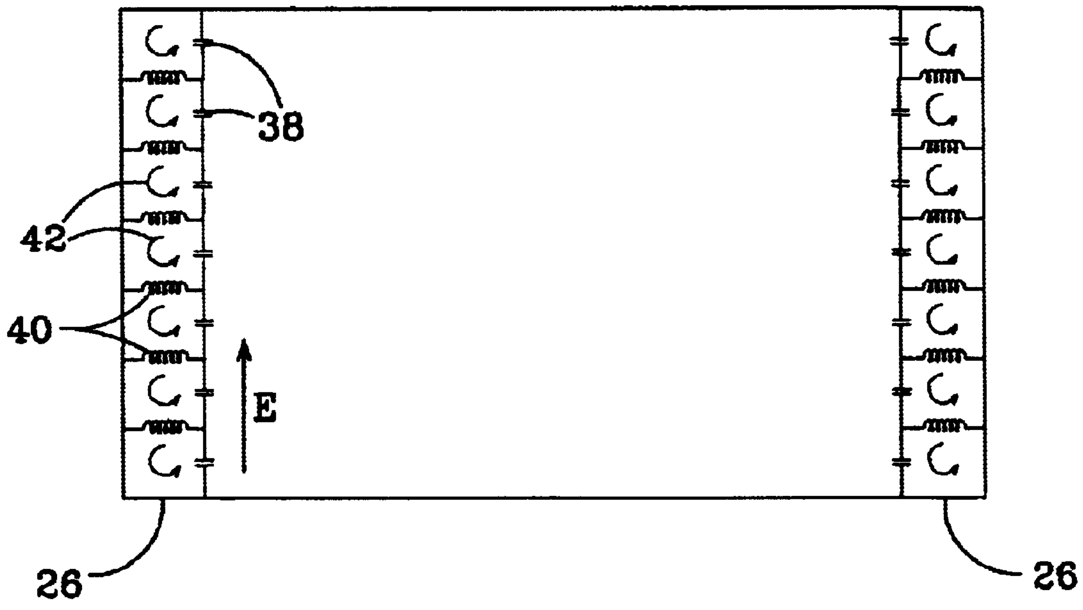
FIG. 4 shows the sidewall's high impedance resonant L-C circuits to a transverse E-field.

With the high impedance structure 26 on the waveguide's sidewalls such that the conductive strips run parallel to the waveguides longitudinal axis, the structure will present a high impedance to the E field component of a vertically polarized signal at the design frequency. As shown in FIG. 4, the gap 32 presents a capacitance 38 to the E field component that is transverse to the conductive strips. The capacitance 38 is primarily dependent upon the width of the gap 32 between the strips 30 but is also impacted by the dielectric constant of the dielectric material 28. The structure 26 also presents an inductance 40 to a transverse E field, the inductance 40 being dependant primarily on the thickness of the dielectric material 28 and the diameter of the vias 36. At resonant frequency, the structure presents parallel resonant L-C circuits 42 to the vertically polarized signal and, as a result, a high impedance to a transverse E field. The E field maintains uniform power density across the waveguide, during transmission through the waveguide.

Current can flow along the top and bottom waveguide walls in the direction of propagation and as a result, the design frequency signal also maintains a uniform H field during transmission. With a uniform density E and the H field, the signal maintains uniform power density through transmission, with minimal attenuation.

The wall structure 26 also has a snorting switch 39 at each of the gaps 32 that short their respective gap when closed, the details of the switches described below and shown in FIGS. 11–14. When the switches 39 are open, the structure functions as described above, presenting a high impedance to a transverse E field. The gaps 32 form the capacitive part of the resonant L-C circuits and by closing the switches 39, the gaps 32 and their capacitance are shorted. The conductive strips 30 and closed switches 39 change the characteristics of the structure 26 such that it presents as continuous conductive sheet. The waveguide 12 now has conductive sidewalls along with the conductive top and bottom walls. Because the waveguides physical dimension "A" in FIG. 2 is less than the critical dimension required for the frequency, signal transmission is cut-off and blocked. In the preferred embodiment, the switches 39 in all the waveguides of the shutter switch 10 are closed simultaneously, causing all the waveguides to block transmission of the signal.

Cross-polarized Beams

FIGS. 5 and 6 show a second embodiment of a waveguide 50 used to construct the shutter switch. It operates similarly to the waveguide in FIGS. 1 and 2, but can block one or both polarizations (horizontal and vertical) if they are simultaneously present.

The waveguide 50 has the high impedance structure 57 on all four walls 51–54, with the corresponding shorting switches 56 at each gap between the conductive strips 55. The conductive strips 55 are oriented longitudinally down the waveguide 50. The structure on all four walls 51–54 allows the waveguide 50 to simultaneously transmit signals with horizontal and vertical polarizations while maintaining a uniform power density. The signal with vertical polarization will have an E field with uniform density as a result of the high impedance presented by the structure 57 on the sidewalls 51 and 53. Current flows along the strips of the structure on the waveguide's top wall 54 and/or bottom wall 52 of the waveguide, maintaining a uniform H field. For the portion of the signal having horizontal polarization, the E field maintains uniform power density because of the wall structure at the top wall 54 and bottom wall 52, and the H field remains uniform because of current flowing along the strips of the sidewalls 51 and 53. Thus, when the waveguide is transmitting, the power density of the cross polarized signal is uniform across the waveguide.

Closing all the switches 56 on all of the waveguide's walls causes them to appear as conductive surfaces. The waveguide will appear as a metal waveguide to both polarizations and because of the waveguide's dimensions A and B, transmission will be cut-off and blocked.

However, closing the switches on the waveguide's sidewalls 51, 53 only causes the waveguide 50 to appear as a metal waveguide to the vertically polarized signal and blocks only that portion of the cross-polarized signal. The E field of the vertically polarized signal is transverse to the conductive strips 55 on the waveguide's sidewalls 51, 53, and the sidewalls with present as a high impedance series of L-C circuits. However, closing the switches 56 on the sidewalls 51, 53 causes them to appear as a conductive surface to the signal's E field. For the H field component of the vertically polarized signal, current runs down the strips 55 on the top and bottom walls 52, 54. As a result, the waveguide 50 appears as though all its wall are conductive and the transmission of the vertically polarized signal is cut-off.

Similarly, for the horizontally polarized signal, the top and bottom walls 52, 54 appear as a high impedance to the E field, maintaining its uniform density, and the strips 55 on the sidewalls 51, 53 allow current to flow, maintaining a uniform H field. When the switches are closed on the top and bottom walls 52, 54, all of the waveguide's walls will appear conductive to the horizontally polarized signal, and transmission of that portion will be cut-off.

The structure 57 is manufactured using similar materials and processes described above for the embodiment shown in FIGS. 2 and 3, and the manufacturing of the shorting switches is described below. By selectively closing the switches on opposing walls of the waveguide 50, the horizontal portion, vertical portion, or both, can be cut-off. A shutter switch constructed of these waveguides can selectively block portions of a cross-polarized beam, or the entire beam.

Multi-frequency Single and Cross-polarized Beams

Figure 7:
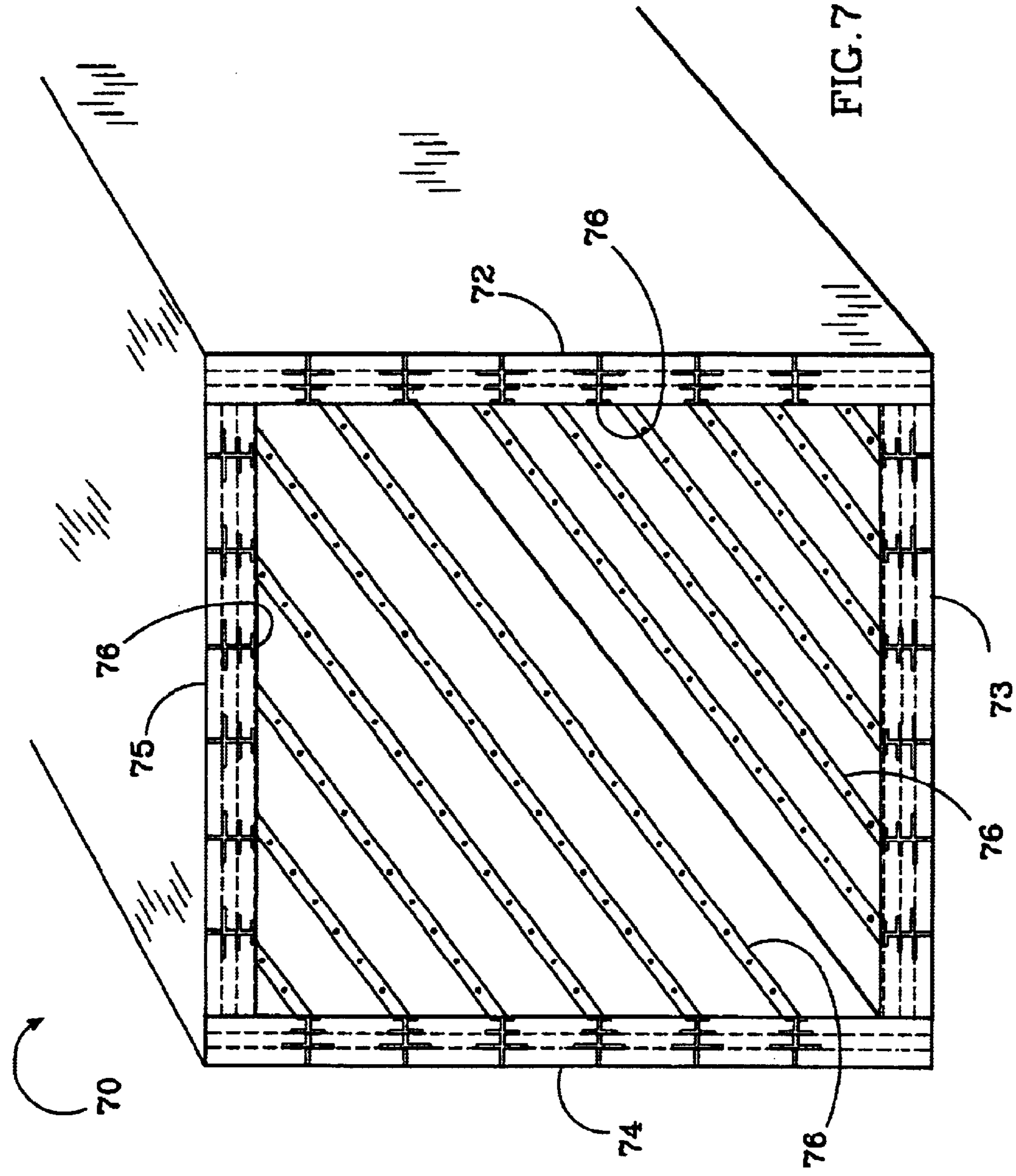
FIG. 7 is a perspective view of a third embodiment of the waveguides with a layered high impedance structure on all of its walls.

FIG. 7 shows another embodiment of the waveguide 70 used to construct the shutter switch 10. The waveguide has a three-layered high impedance 71 structure its walls 72–75. In alternative embodiment the structure 71 can be on the waveguides sidewalls 72, 74 with its top and bottom walls 73, 75 being conductive, or the structure can be on the waveguides top and bottom walls 73, 75 with its sidewalls 72, 74 being conductive. The structure 71 can have different numbers of layers, depending on the number of frequencies to be transmitted by the waveguide. The structure 71 shown has three layers and presents a high impedance to transverse E fields at three different resonant frequencies.

Figure 8:
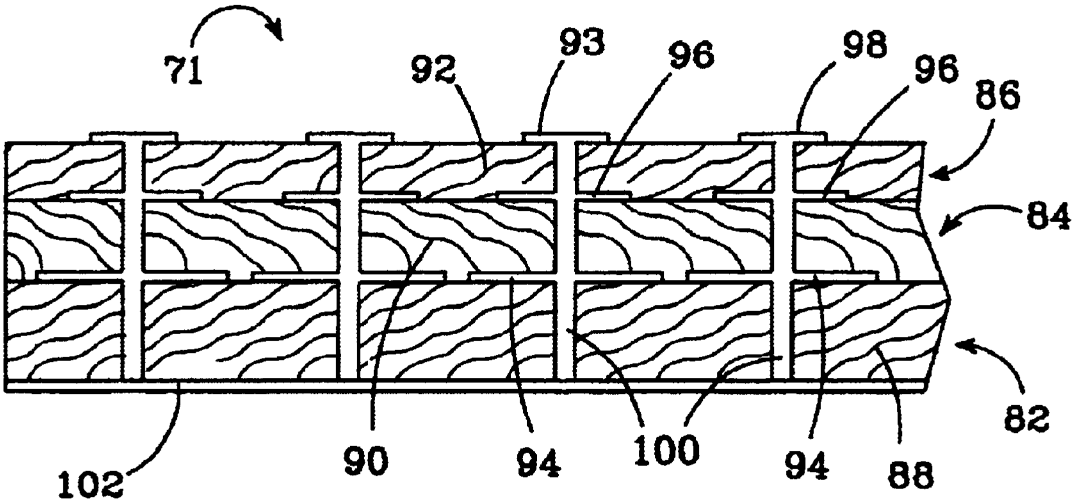
FIG. 8 is a sectional view of layered high impedance structure.

Referring to FIG. 8, each of the layers 82, 84, 86 in the structure 71 include respective dielectric substrates 88, 90, 92 that are progressively thinner from the bottom layer 82 to the top 86. Conductive strips 94, 96, 98 are provided respectively on each of the substrates 82, 84, 86 and their width is progressively smaller from the bottom layer to the top. The strips in each layer are parallel and aligned over the strips in the layers below and above, and preferably have uniform width and a uniform gap between adjacent strips. Because the width of the strips 94, 96, 98 progressively decreases for each successive layer, the gaps between adjacent strips progressively increases. The higher frequency strips with smaller dimensions are situated on the upper layers. In an alternative embodiment, (not shown) there may be as many as three to five higher frequency strips positioned on each lower frequency strip.

The structure 71 includes vias 100 that connect each vertically aligned set of strips to a ground plane conductive layer 102 located at the underside of the bottom layer 82. The preferred vias 100 are equally spaced down the longitudinal centerlines of the strips 94, 96, 98. Alternatively, the location of the vias 50 can be staggered for adjacent strips.

The structure 71 is formed by stacking the layers 82, 84, 86 after their dielectric substrates have been metalized. Numerous materials can be used for the dielectric substrates, including but not limited to plastics, poly-vinyl carbonate (PVC), ceramics, or high resistance semiconductor materials such as Gallium Arsenide (GaAs), all of which are commercially available. Each layer in the structure 71 can have a dielectric substrate of a different material and/or a different dielectric constant. A highly conductive material such as copper or gold (or a combination thereof) should be used for the conductive layer 102, strips 94, 96, 98, and vias 100.

The strips 94, 96, 98 on each layer are formed prior to stacking by first depositing a layer of conductive material on one surfaces of each dielectric substrate 88, 90, 92. Parallel gaps in the conductive material are then etched away using any of a number of etching processes such as acid etching or ion mill etching. Within each layer, the etched gaps are preferably of the same width and the same distance apart, resulting in parallel conductive strips on the dielectric substrate of uniform width and with uniform gaps between adjacent strips.

The different layers 82, 84, 86 are then stacked with the strips for each layer aligned with corresponding ones in the layers above and below, resulting in aligned strips 94, 96, 98. The layers 82, 84, 86 are bonded together using any of the industry standard practices commonly used for electronic package and flip-chip assembly. Such techniques include solder bumps, thermos-sonic bonding, electrically conductive adhesives, and the like.

Once the layers 82, 84, 86 are stacked, holes are formed through the structure for the vias 100. The holes can be created by various methods, such as conventional wet or dry etching. The holes are then filled or at least lined with the conductive material and preferably at the same time, the exposed surface of the bottom substrate is covered with a conductive material to form conductive layers 102. A preferred processes for this is sputtered vaporization plating. The holes do not need to be completely filled, but the walls must be covered with the conductive material sufficiently to electrically connect the ground plane to the radiating elements of each layer.

Each of the layers 82, 84, 86 presents a pattern of parallel resonant L-C circuits and a high impedance to an E field for different resonant frequencies. The bottom most layer 82 presents a high impedance to the lowest frequency and the top most layer 86 presents as a high impedance to the highest frequency. To present the high impedance, at least a component of, and preferably the entire E field, must be transverse to the strips 94, 96, 98. A signal normally incident on this structure will ideally be reflected with a reflection coefficient of +1 at the resonant frequency, as opposed to a −1 for a conductive material.

Like the embodiments described above, the capacitance of each layer 82, 84, 86 is primarily dependent upon the widths of the gaps between adjacent strips or patches, but is also impacted by the dielectric constants of the respective dielectric substrates. The inductance is primarily dependent upon the thickness of the substrates 88, 90, 92 and the diameter of the vias 100.

The dimensions and/or compositions of the various layers 82, 84, 86 are different to produce the desired high impedance to different frequencies. To resonate at higher frequencies, the thickness of the dielectric substrate can be decreased, or the gaps between the conductive strips can be increased. Conversely, to resonate at lower frequencies the thickness of the substrate can be increased or the gaps between the conductive strips or patches can be decreased. Another contributing factor is the dielectric constant of the substrate, with a higher dielectric constant increasing the gap capacitance. These parameters dictate the dimensions of the structure 71. Accordingly, the layered high impedance ground plane structures described herein are not intended to limit the invention to any particular structure or composition.

Figure 9:
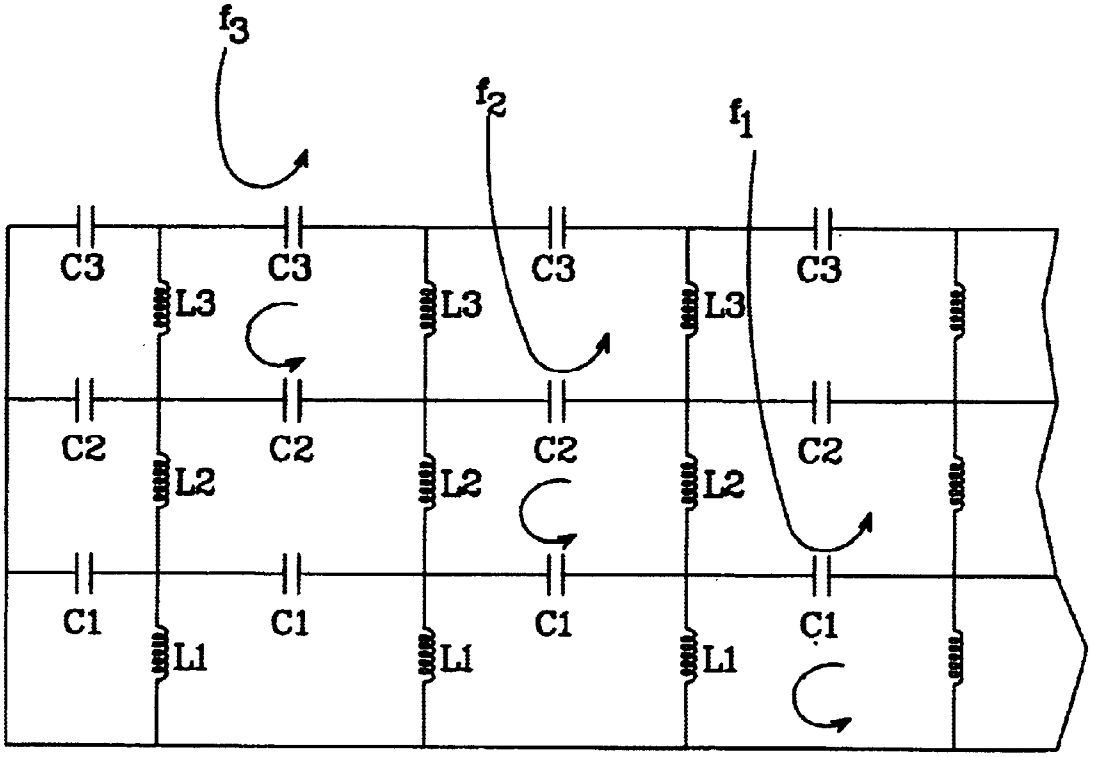
FIG. 9 is a diagram of L-C circuits formed by the layered wall structure in response to the E fields of three different frequencies.

FIG. 9 illustrates the network of capacitance and inductance presented by a new three layer structure which produces an array of resonant L-C circuits to three progressively higher frequencies f1, f2 and f3. The bottommost layer appears as a high impedance surface to signal f1 as a result of a series of resonant L-C circuits, with L1/C1 representing the equivalent inductance and capacitance presented by the bottommost layer to its design frequency bandwidth. The second and third layers also for respective series of resonant L-C circuits L2/C2 and L3/C3, at their frequency bandwidths.

Figure 10A:
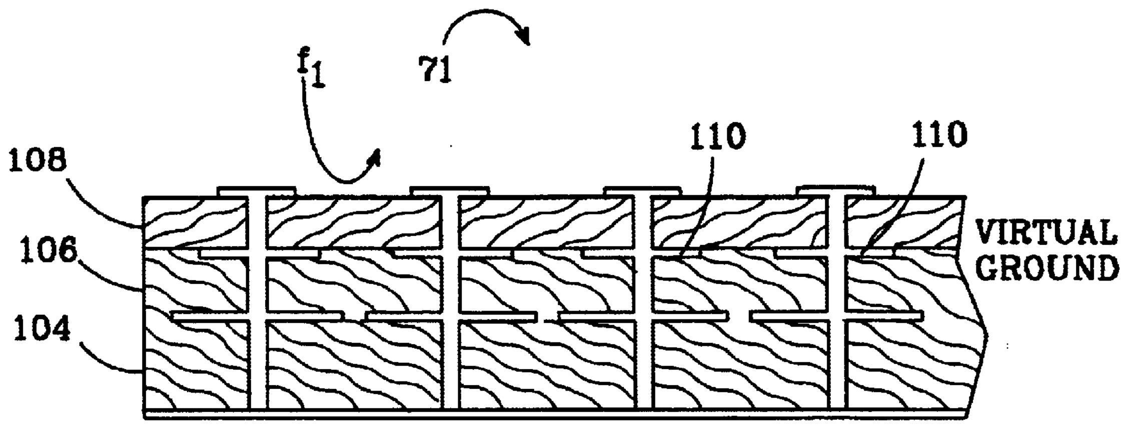
FIGS. 10*a*–10*c* are sectional views of a three-layer embodiment of the invention, illustrating how three different frequencies interact with the different layers.
Figure 10B:
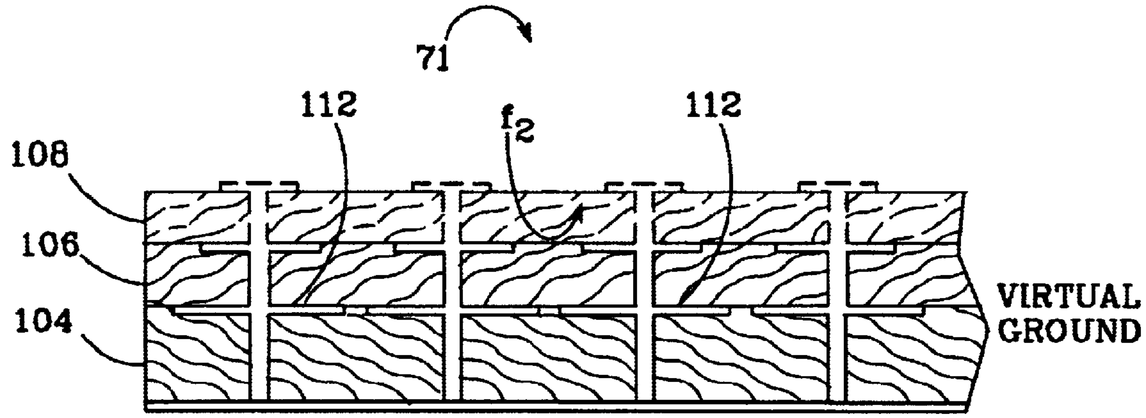
Figure 10C:
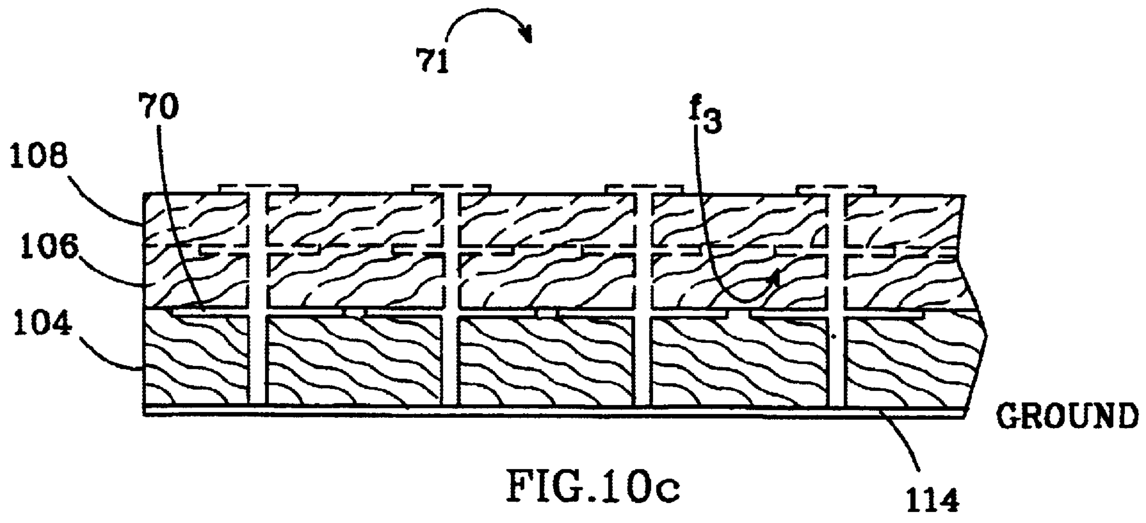

FIGS 10*a*–10*c* illustrate how the three signals interact with layers of the new structure 71. An important characteristic of the structure's layers 104, 106, and 106 is that each appears transparent to E fields at frequencies below its design frequency, and the strips appear as a conductive surface to E fields at frequencies above its design frequency. For the highest frequency signal f1, the top layer 108 presents as high impedance resonant L-C circuits to the signal's transverse E field. The strips 110 on second layer 106 appear as a conductive layer and become a "virtual ground" for the top layer 108. Signal f2 is lower in frequency than f1 and, as a result, the first layer 104 is transparent to f2's E field, while the second layer 106 appears as high impedance resonant L-C circuits. The strips 112 on the third layer appear as a conductive layer, becoming the second layer's virtual ground. Similarly, at f3 the top and second layers 108 and 106 are transparent, but the third layer 104 appears as high impedance resonant L-C circuits, with the conductive layer 114 being ground for the third layer 104.

Referring again to FIG. 7, the new layered structure 71 is mounted on the interior of all four walls 72–75, with the conductive strips 76 oriented inward and longitudinally down the waveguide. The layered structure 71 allows the waveguide 70 to transmit signals at multiple frequencies, with uniform density at both horizontal and vertical polarizations. For a three layered structure, the waveguide can transmit three different frequencies, with each of the layers responding to a respective frequency.

The vertically polarized signal maintains a uniform density as a result of the high impedance presented by the wall structure on the sidewalls 72, 74 and current flowing along the strips 76 on the top wall 75 and/or bottom wall 76. The horizontally polarized signal maintains uniform power density because of the layered structure at the top and bottom wall 75, 76, and current flowing down the conductive strips 76 of the sidewalls 72 and 74. Thus, the cross-polarized signal has a generally uniform power density across the waveguide. If the waveguide is transmitting a signal in one polarization (vertical or horizontal), it only needs the new layered structure on only two opposing walls to maintain the signals uniform power density.

Shorting switches 116 are shown as symbols on the top layer of the structure 71 on the walls 72–75, and the details of the switches are described below and shown in FIGS. 11–14. If the switches are closed on the top layer on all four of the waveguide's walls, the waveguide 70 is changed from transparent to opaque at all three frequencies. For instance, at the lowest frequency, when the first two layers of the structure appear transparent and closing the switches on the top layer shorts the gap capacitance and causes the signal to see only the conductive surface presented by the top layer's conductive strips and closed switches. The same is true for the next higher frequencies. Closing the switches causes them to see only a conductive surface, cutting off transmission.

Closing the shorting switches 116 on the sidewalls 72, 74 blocks transmission of vertically polarized signals at all three frequencies. The structure on the top and bottom presents as a high impedance to the E field of horizontally polarized signals and the waveguide still transmits the horizontal signals at all three design frequencies. The shorting switches 116 are closed on the top and bottom walls 73, 75 to block transmission of the horizontally polarized signals, while still transmitting the vertically polarized signals at all three frequencies.

If switches 116 are included at each of the layers (not shown) then different frequencies at different polarizations can be selectively blocked. For example, f3 could be blocked in both polarizations if the switches 116 are closed on the bottom layer 82 (shown in FIG. 8) on all four walls. Only for f3 will the all the layers appear as conductive layers, cutting off transmission at f3. If the shorting switches 116 are closed on the bottom layer 82 on the top and bottom walls 73, 75 only, transmission of the horizontally polarized signal at f3 is blocked, while still transmitting the vertically polarized signals at f3. If the switches 116 are closed on the bottom layer 82 on the sidewalls, transmission of the vertically polarized signal at f3 is blocked. By selectively closing the switches 116 at the other layers 84, 86, the different frequencies in different polarization can be blocked.

Switching Mechanisms

The shorting switches used to short the conductive strips can employ many different known switches, with the preferred switches using micro electromechanical system (MEMS) technology or varactor layer diode technology. MEMS switches are generally described in Yao and Chang, "A Surface Micromachined Miniature Switch For Telecommunication Applications with Signal Frequencies from DC up to 4 Ghz," In Tech. Digest (1995), pp. 384–387 and in U.S. Pat. No. 5,578,976 to Yao, which is assigned to the same assignee as the present application. U.S. Pat. No. 5,578,976 to Yao, also discloses and discusses the design trade-offs in utilizing MEMS technology and the fabrication process for MEMS switches.

Figures 11, 12, 13:
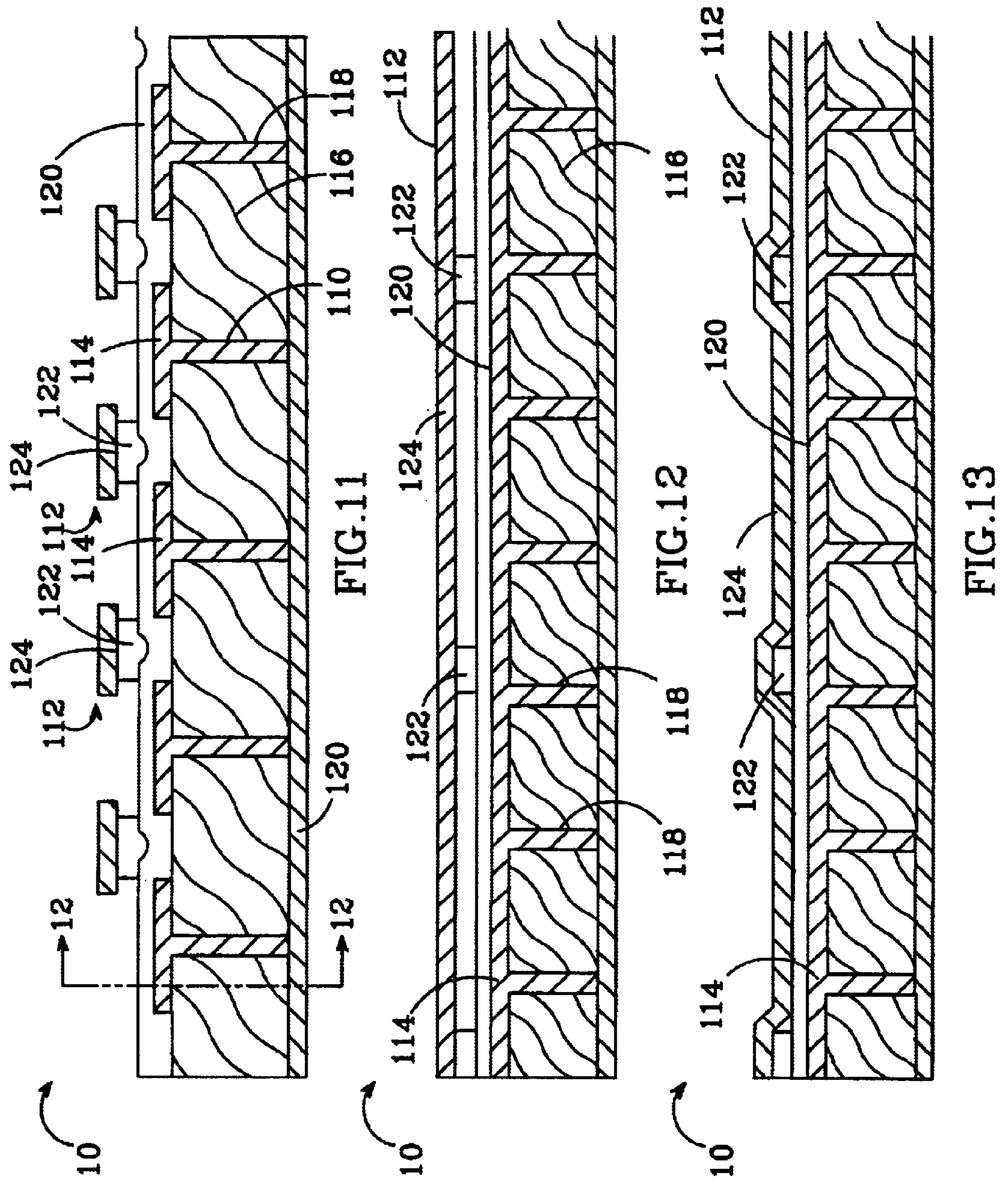
FIG. 11 is a sectional view of the high impedance structure with MEMS switches to short the gaps between the conductive strips.
FIG. 12 is a sectional view of the structure shown in FIG. 11, taken along section lines 12—12.
FIG. 13 is the sectional view of the structure shown in FIG. 12 with the switches in the closed state.

FIGS. 11, 12 and 13, show one embodiment or the MEMS shorting switches 132 constructed in accordance with the present invention to short the conductive strips 134 in the high impedance structure 130. The switches 132 are fabricated using generally known micro fabrication techniques, such as masking, etching, deposition, and lift-off. FIG. 11 is a sectional view of the high impedance structure 130 taken transverse to the conductive strips 134. FIG. 12 is a sectional view taken long sectional lines one of the shorting switches. 132. Both show high impedance structure's dielectric material 136, vias 138 and conductive layer 140.

The switches 132 are manufactured by depositing semiconductor layer 140 over the conductive strips 134 and over the exposed surface of the dielectric material 136, the preferred semiconductor material being $Si_3N_4$. Stand-off isolators 142 are deposited at intervals down the gap between the conductive strips 134 and are preferably formed of an insulator material such as silicon dioxide. A respective strip of metallic material 144 is mounted over each of the gaps by affixing it on the top of the standoffs offs 142 along one of the gaps.

In operation, each metallic strip 144 has either 0 volts or voltage potential applied, with the preferred potential being 50 volts. With 0 volts applied, the strips 134 remain suspended above their respective gap between the stand off isolators 142 as shown in FIG. 12. The switches are in the "Off" state and the structure 130 presents as a high impedance to the design frequency E field transverse to the conductive strips 134. The gaps between the strips 134 presents a capacitance and the vias 138 present an inductance, with the structure presenting as a series of resonant L-C circuits to the transverse E field.

Referring now to FIG. 13, to close the switch 132 and short the gap between conductive strips 134 a 50 volt potential is applied to the metallic strips 144. This causes an electrostatic tension between the metallic strips 144 and the respective conductive strips 134 below, pulling the switch strip down such that it makes capacitive contact with the strip 134 on each side of the gap. This provides a conductive bridge across the gap, shorting the gap. With all the metallic strips 144 pulled to the strips 134 below, the high impedance structure appears as a conductive surface to the signals E field. This switching network consumes very little and has a very fast closure time on the order of 30 $\mu$s.

Figure 14:
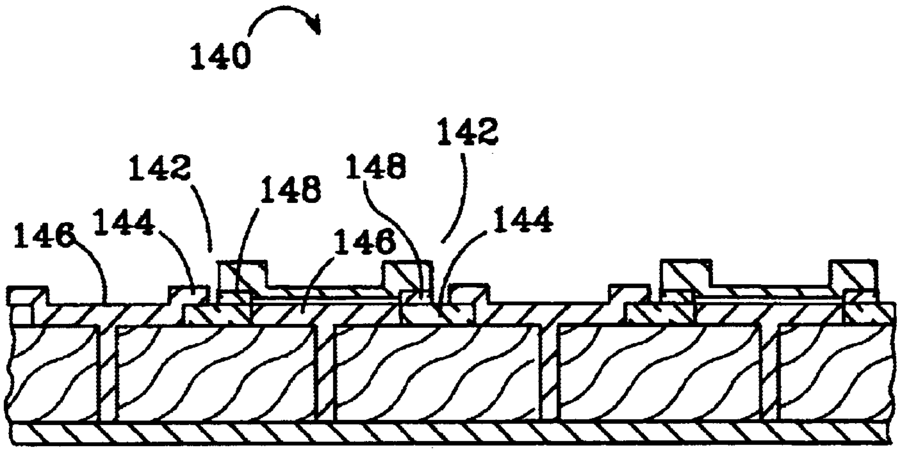
FIG. 14 is a sectional view of the high impedance structure with semiconductor varactor layers to short the gaps between the conductive strips.

FIG. 14 shows a high impedance structure 150 with a second embodiment of the shorting switches 152 that utilize varactor diode technology to short the gaps. The varactor diode is an ordinary junction diode that relies on its voltage dependent capacitance. Each varactor switch includes a N+ (highly conducting) layer 154 grown or deposited in the each gap between the conductive strips 156. An N− (moderately conducting) layer 158 is grown on top of top of a portion of the N+ layer 154.

In fabricating the switches 152, the N+ and N− layers 154 and 158 are etched into mesas that will provide a strip of varactor material along the length of the gaps between the conductive strips 156. The switching of the varactor is controlled by a second conductive strip 160 sitting on an insulator layer 162 that is sandwiched between the second strip 160 and each conductive strip 156. The insulator layer 162 provides a capacitive coupling to conductive strip 156 and the ground plane. Voltage applied to the second strip 160 controls the capacitance of the varactor layer and thus the shorting of the gap.

The presence of zero voltage on the varactor layer creates a high capacitance at the gap, virtually shorting (closing) the gap. This causes the high impedance structure to appear as a conductive surface, cutting off transmission of the signal and making the shutter switch appear opaque. When a high voltage is applied to the varactor the capacitance at the gap is reduced. The high impedance structure is then resonant at the operating frequency and the waveguide will transmit the beam. With all its waveguides transmitting, the shutter switch appears transparent to the incident beam.

Figure 15:
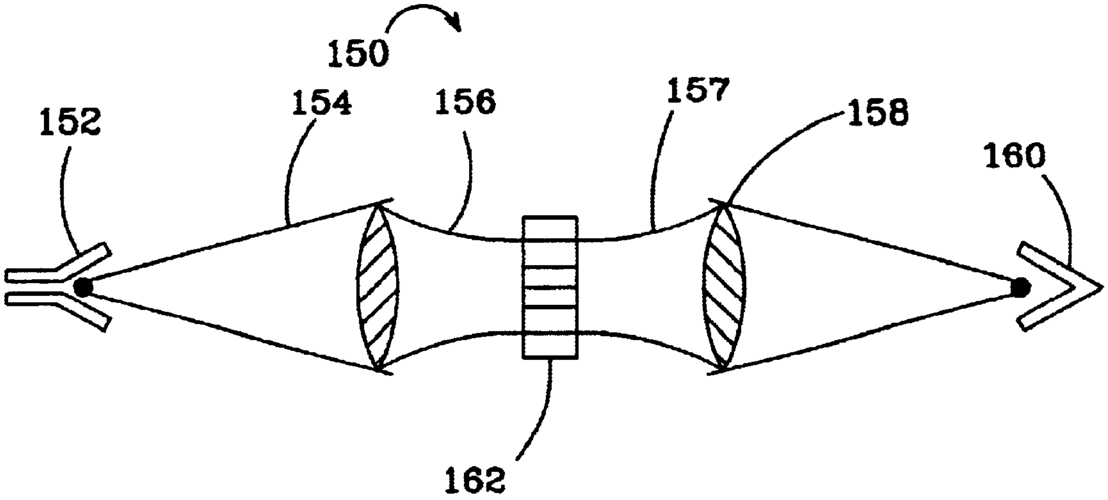
FIG. 15 shows the new shutter switch used in millimeter beam transmission.
Figure 11:
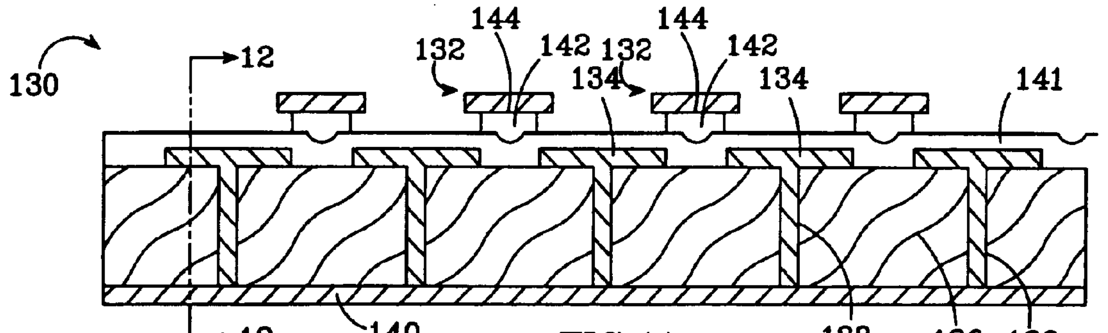
Figure 12:
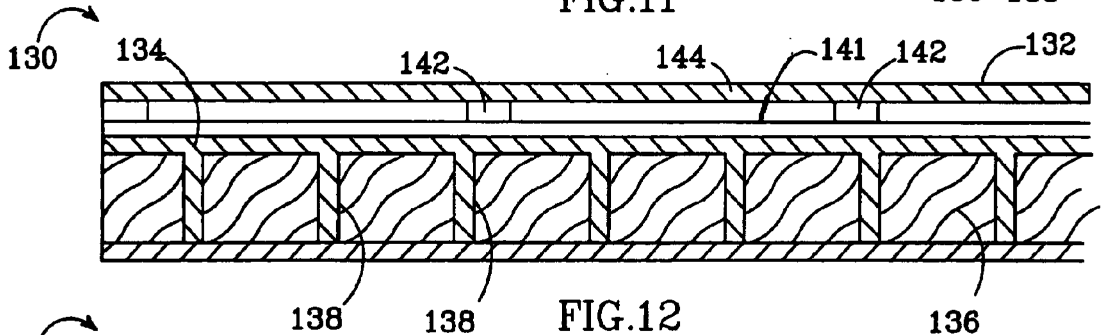
Figure 13:
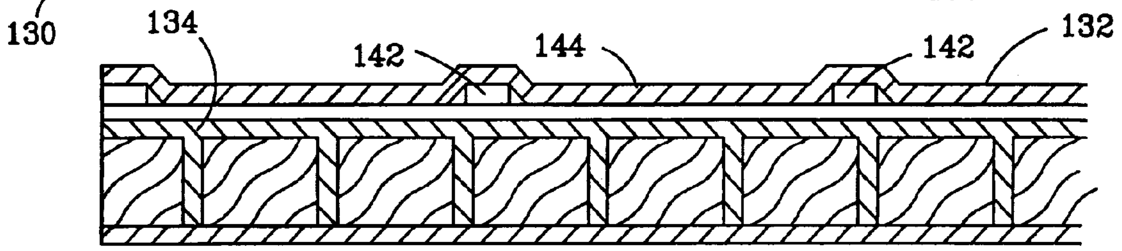
Figure 14:
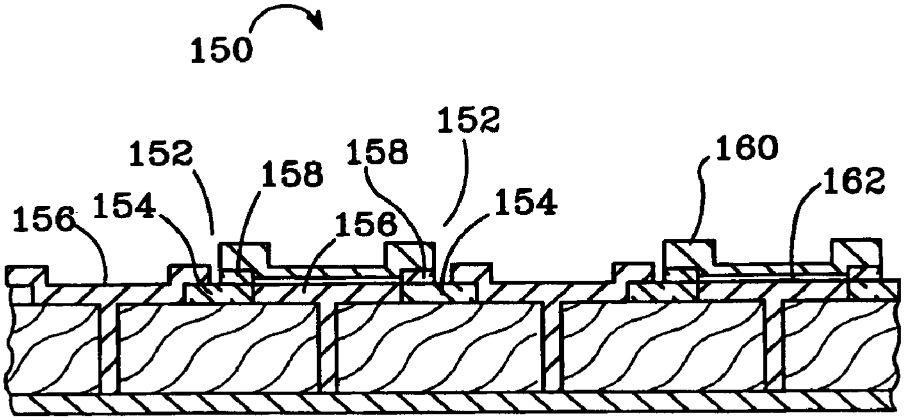
Figure 15:
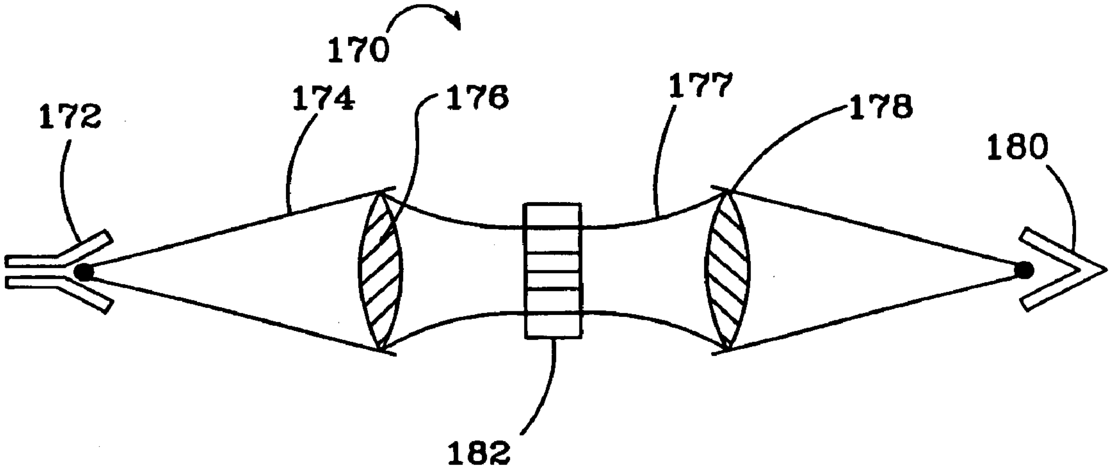

FIG. 15 shows millimeter beam transmission system 170 used in various high frequency applications such as munitions guidance systems (e.g. seeker radar). A transmitter 172 generates a millimeter signal 174 that spreads as it moves from the transmitter. Most of the signal is directed toward a lens 176 that collimates the signal into a beam 177 with little diffraction. The collimated beam travels to a second lens 158 that focuses the beam to a receiver 180. The shutter switch 182 is positioned between a millimeter wave transmitter 172 and receiver 180 such that it intercepts the transmission beam 177. When the shorting switches on the shutter switch's waveguides are open, the shutter switch 182 is transparent to the beam and the signal passes from the transmitter 172 to the receiver 180. When the shorting switches are closed, transmission of the signal through each of the waveguides is cut-off, making the shutter switch 182 opaque to the beam 177 and blocking transmission from the transmitter to the receiver.

As described above, when the waveguides in the shutter switch 182 have the high impedance structure on the sidewalls and the top and bottom walls, the beam can have horizontal and vertical polarization and the shutter switch 182 can block one or both of the polarizations. When the high impedance structure has multiple layers, the shutter switch can be transparent or block signals at multiple frequencies and at one or both polarizations.

Although the present invention has been described in considerable detail with reference to certain preferred configurations thereof, other versions are possible. The waveguides in the shutter switch can have different high impedance structures and the new shutter switch can be used in other applications. Therefore, the spirit and scope of the appended claims should not be limited to their preferred versions describes therein or to the embodiments in the above detailed description.

I claim:

1. A shutter switch for an electromagnetic wave beam, comprising:

a plurality of waveguides adapted to receive at least part of an electromagnetic beam, said waveguides being adjacent to one another with their longitudinal axes aligned with the propagation of said beam, said waveguides switchable to either transmit or block transmission of their respective portions of said beam, wherein each of said waveguides comprises:

four wall inside surfaces comprising two opposing sidewalls and a top and bottom wall;

respective high impedance wall structures on at least two opposing walls, said wall structures presenting a high surface impedance to E fields transverse to the waveguide axis and tangential to the said opposing wall structure, and a low impedance to E fields parallel to the waveguide axis; and shorting arrangements on each said wall structures to short circuit their high impedances;

each of said waveguides having internal dimensions to cut-off the transmission of its respective portion of said beam when its high impedance wall structure is short circuited to a low impedance state.

2. The shutter switch of claim 1, wherein each said high impedance wall structure comprises:

a sheet of dielectric material having two sides;

a conductive layer on one outer side of said dielectric material;

a plurality of mutually spaced conductive strips on the other inner side of said dielectric material, said strips having gaps between adjacent said strips and being aligned parallel to the guide longitudinal axis; and a plurality of conductive vias extending through said dielectric material between said conductive layer and said conductive strips.

3. The shutter switch of claim 2, wherein said high impedance structure are provided on said waveguide's sidewalls and top and bottom walls and present a high impedance to the E field component of both vertically and horizontally polarized beams.

4. The shutter switch of claim 2, wherein said conductive strips have a uniform width and are disposed with a uniform gap between adjacent strips.

5. The shutter switch of claim 2, wherein adjacent pairs of said, strips present a capacitance and said dielectric sheet presents an inductance to an electromagnetic beam with an E field transverse and tangential to said conductive strips.

6. The shutter switch of claim 5, wherein said conductive strips and dielectric material present a series connection of parallel L-C circuits, resonant at an operating frequency, to an electromagnetic beam with an E field transverse and tangential to said conductive strips.

7. The shutter switch of claim 2, wherein said sheet of dielectric material comprises plastic, polyvinyl carbonate (PVC), ceramic or high resistant semiconductor material.

8. The shutter switch of claim 2, wherein said high impedance structure are provided on said waveguide's sidewalls and present a high impedance to the E field component of a vertically polarized guided beam.

9. The shutter switch of claim 2, wherein said high impedance structure are provided on said waveguide's top and bottom walls and present a high impedance to the E field component of a horizontally polarized guided beam.

10. The shutter switch of claim 2, wherein said shorting arrangements change said high surface impedance structure to a conductive surface by shorting said gaps between said conductive strips.

11. The shutter switch of claim 10, wherein said shorting arrangements comprise micro electromechanical systems (MEMS) switches.

12. The shutter switch of claim 11, wherein each of said MEMS shorting arrangements comprises a shorting strip suspended over said gap between a respective pair of said conductive strips, said gap being shorted by applying a voltage potential to adjacent electrodes creating an electrostatic tension that pulls said shorting strip down to said conductive strips to form a conductive bridge across said gap between said conductive strips.

13. The shutter switch of claim 10, wherein said shorting comprise varactor diode in each of said gaps.

14. The shutter switch of claim 13, wherein each of said varactor diode places a variable capacitance across its respective said gap such that a voltage may be applied to detune the parallel L-C circuits away from said operating frequency thus rendering the high surface impedance to a low impedance state and causing a cut-off state for said guide at said operating frequency.

15. The shutter switch of claim 1, wherein said high impedance wall structure comprises:

a plurality of stacked high impedance layers, each presenting a high impedance surface to the E field component of a different respective electromagnetic beam operating frequency and being transparent to the E fields of lower operating frequency signals, and presenting a low impedance surface to the E field of higher operating frequency signals; and the bottommost said layer presenting a high impedance surface to the E field of the lowest frequency of said operating signals, and each succeeding layer presenting a high impedance surface to the E field of successively higher operating frequencies.

16. The shutter switch of claim 15, wherein said high impedance structures are on said waveguide's sidewalls and top and bottom walls and present a high impedance to the E field component of said different frequency beams having both vertical and horizontal polarization.

17. The shutter switch of claim 15, wherein each of said high impedance layers comprises a substrate of dielectric material having a top and bottom surface and a plurality of conductive strips on said substrate's top surface with gaps between adjacent conductive strips, and further comprising a conductive layer on the bottom surface of the bottommost layer's dielectric substrate.

18. The shutter switch of claim 15, wherein corresponding conductive strips of said high impedance layers are aligned along the guide longitudinal axis and said high impedance layers further comprise conductive vias through said dielectric substrates between said aligned conductive strips and said conductive layer.

19. The shutter switch of claim 15, wherein said conductive strips on each said layers have uniform widths and uniform gaps between adjacent strips.

20. The shutter switch of claim 15, wherein each of said high impedance layers presents a series connection of resonant parallel L-C circuits to the E field of its respective operating frequency.

21. The shutter switch of claim 15, wherein the widths of said strips decreases and the width of said gaps between adjacent conductive strips increases with succeeding high impedance layers from the bottommost layer to the topmost.

22. The shutter switch of claim 15, wherein said high surface impedance wall structures are on said waveguide's sidewalls and present a high impedance to the E field component of said different frequency beams having vertical polarization.

23. The shutter switch of claim 15, wherein said high impedance wall structures are on said waveguide's top and bottom walls and present a high impedance to the E field component of said different frequency beams having horizontal polarization.

24. The shutter switch of claim 17, further comprising shorting arrangements on each of said plurality of layers to change said high surface impedances to a conductive surfaces by shorting said gaps between said conductive strips.

25. The shutter switch of claim 24, wherein said shorting arrangements comprises micro electromechanical systems (MEMS) switches.

26. The shutter switch of claim 25, wherein each of said MEMS switches comprises a shorting strip suspended over said gap between a respective pair of said conductive strips, said switch being closed by applying a voltage potential to adjacent electrodes creating an electrostatic tension that pulls said shorting strip down to said conductive strips to form a conductive bridge across said gap between said conductive strips.

27. The shutter switch of claim 24, wherein said shorting switches comprise varactor diode in each of said gaps.

28. The shutter switch of claim 27, wherein said shorting arrangements are closed on selective layers of said high impedance structures to block transmission of one or both polarities of said beam at one or all of said different frequency signals.

29. The shutter switch of claim 27, wherein each of said varactor diode places a variable capacitance across its respective said gap such that a voltage may be applied to detune the parallel L-C circuits away from said operating frequency thus rendering said high surface impedance to a low impedance state.

30. A millimeter beam transmission system, comprising;

an electromagnetic beam transmitter;

an electromagnetic beam receiver;

a shutter switch positioned in the path of said beam between said transmitter and receiver, said shutter switch comprising at least one waveguide positioned to receive at least part of said beam, the longitudinal axis of each if said waveguides aligned with the propagation of said beam, each of said waveguide being switchable to either transmit or block transmission of its respective portion of said beam, wherein each said waveguide comprises:

four wall inner surfaces comprising, two opposing sidewalls and a top and bottom wall;

a high impedance wall structure on at least two opposing walls of said waveguide, said wall structure presenting a high surface impedance to E fields transverse to the waveguide axis and tangential to the wall structure, and a low impedance to E fields parallel to the waveguide axis; and shorting arrangements on each said high impedance structure to change the high surface impedance of said structure to a low impedance surface.

31. The system of claim 30, wherein said high impedance structure are provided on said waveguide's top and bottom walls such that said high impedance structure presents a high surface impedance to an E field component of a horizontally polarized beams at one or more operating frequencies.

32. The system of claim 30, wherein said high impedance structures are provide on said waveguide's sidewalls and top and bottom walls and present a high impedance to the E transverse and tangential field components of a vertically and horizontally polarized beams at one or more operating frequencies.

33. The system of claim 32, wherein said shorting arrangements are closed on selective layers of said high impedance structures to block transmission one or both polarities of said beam at one or all of said different operating frequency signals.

34. The system of claim 30, wherein each said waveguide has inner dimensions such that the transmission of said electromagnetic beam is cut-off when said waveguide sidewalls and top and bottom walls are low impedance surfaces.

35. The system of claim 30, wherein each said high impedance wall structure comprises:

a sheet of dielectric material having two sides;

a conductive layer on one outer side of said dielectric material;

a plurality of mutually spaced parallel conductive strips on the other inner side of said dielectric material; and a plurality of conductive vias extending through said dielectric material between said conductive layer and said conductive strips.

36. The system of claim 35, wherein said conductive strips have a uniform width, are disposed with a uniform gap between adjacent strips and are parallel to the longitudinal axis of their respective said waveguide.

37. The system of claim 36, wherein said conductive strips, vias and dielectric material present a series connection of parallel L-C circuits to an electromagnetic wave with an E field transverse and tangential to said conductive strips.

38. The system of claim 36, wherein said shorting arrangements change said high surface impedance structure to a low impedance surface by shorting said gaps between said conductive strips.

39. The system of claim 30, wherein said high impedance wall structure comprises:

a plurality of stacked high surface impedance layers, each presenting a high surface impedance to the E field component of a different respective electromagnetic beam operating frequency and being transparent to the E fields of lower frequency signals, and presenting a low impedance surface to the E field of higher frequency signals; and the bottommost said layer presenting a high surface impedance to the E field of the lowest frequency of said signals, and each succeeding layer presenting a high surface impedance to the E field of successively higher frequencies.

40. The system of claim 39, wherein each said layer presents a series connection of resonant parallel L-C circuits to the E field of its respective signal operating frequency.

41. The system of claim 39, wherein each of said high impedance layers comprises a substrate of dielectric material having a top and bottom surface and a plurality of conductive strips on said substrate's top surface, and further comprising a conductive layer on the bottom surface of the bottommost layer's dielectric substrate.

42. The system of claim 39, wherein corresponding conductive strips of said layers are aligned along longitudinal axis of said guide and said high impedance structure further comprises conductive vias through said dielectric substrates between said aligned conductive strips and said conductive layer.

43. The system of claim 39, wherein said shorting arrangements change said high surface impedance structure to a low impedance surface by shorting said gaps between said conductive strips.

44. The system of claim 30, wherein said high impedance structure are provided on said waveguide's sidewalls and present a high impedance to a transverse and tangential E field component of vertically polarized beams at one or more operating frequencies.

* * * * *

UNITED STATES PATENT AND TRADEMARK OFFICE

CERTIFICATE OF CORRECTION

PATENT NO. : 6,762,661 B1 
DATED : July 13, 2004
INVENTOR(S) : John A. Higgins

It is certified that error appears in the above-identified patent and that said Letters Patent is hereby corrected as shown below:

Replace drawing sheets 8 and 9 with the corresponding replacement drawing sheets.

<u>Column 11,</u>
Line 63, replace “140” with -- 141 --.

<u>Column 12,</u>
Line 7, replace “134” with -- 144 --.
Line 65, replace “158” with -- 178 --.

Signed and Sealed this

Thirty-first Day of January, 2006

JON W. DUDAS
*Director of the United States Patent and Trademark Office*